(12) United States Patent
Trezza et al.

(10) Patent No.: US 6,337,265 B1
(45) Date of Patent: Jan. 8, 2002

(54) METHOD FOR INTEGRATION OF INTEGRATED CIRCUIT DEVICES

(75) Inventors: John A. Trezza, Nashua; Gregory K. Duddoff, Amherst, both of NH (US)

(73) Assignee: Teraconnect, Inc., Nashua, NH (US)

( * ) Notice: Subject to any disclaimer, the term of this patent is extended or adjusted under 35 U.S.C. 154(b) by 0 days.

(21) Appl. No.: 09/653,369

(22) Filed: Sep. 1, 2000

Related U.S. Application Data

(60) Provisional application No. 60/152,285, filed on Sep. 3, 1999.

(51) Int. Cl.[7] .................................................. H01L 21/44
(52) U.S. Cl. .......................................... 438/612; 438/26
(58) Field of Search .............................. 438/25–28, 612, 438/107, 108, 118, 119

(56) References Cited

U.S. PATENT DOCUMENTS 6,184,066 B1 * 2/2001 Chino et al. ................ 438/118
6,216,941 B1 * 4/2001 Yokoyama et al. ..... 228/180.22

* cited by examiner

Primary Examiner—David Nelms
Assistant Examiner—David Vu
(74) Attorney, Agent, or Firm—Scott J. Asmus; Vernon C. Maine

(57) ABSTRACT

A method for integration of integrated circuit devices includes providing an array of first devices including dummy devices on a first chip; providing an array of contacts on a second chip; flip-chip bonding the first device to the contacts; filing the voids between the two interstitially of the first devices with an underfill; masking the first devices leaving exposed selected dummy devices; removing the dummy devices leaving an array of holes with contacts; providing a spaced array of second devices on a third chip matching the array of holes; flip-chip bonding the second devices to the contacts in the holes; and filling the voids between the chips associated with second devices with an underfill.

17 Claims, 4 Drawing Sheets

METHOD FOR INTEGRATION OF INTEGRATED CIRCUIT DEVICES

RELATED APPLICATIONS

This patent application claims priority of Provisional Patent Application No. 60/152,285 filed Sep. 3, 1999 entitled INTERDIGITIZED VCSEL EMITTERS AND DETECTORS USING BLANKS AS PLACEHOLDERS.

FIELD OF INVENTION

This invention relates to a method for integration of integrated circuit devices and more particularly to such a method for integration of photonic devices such as emitters and detectors.

BACKGROUND OF INVENTION

Hybrid CMOS silicon (Si) and gallium arsenide (GaAs) chip technology, also known as flip-chip, allows for direct optical input/output from fiber bundles onto logic circuits. The electronics is not limited to silicon CMOS; the integration process would be the same using other silicon electronics, such as silicon-germanium or gallium arsenide. However, silicon CMOS is the most advanced today for many applications. The integration of optoelectronic devices with silicon is somewhat problematic for several reasons. Silicon does not have the band-gap structure that supports the generation of light. In addition, there has been very limited success in using epitaxial layers of III–V materials that do support light emission, such as gallium arsenide (GaAs) or indium phosphide (InP), in order to grow light emitting structures on silicon substrates because of the lattice mismatch. If a III–V device is to be attached to a silicon substrate it must be grown on a separate substrate comprised of an appropriate material and later attached to the silicon. It is desirable to have multiple types of photonic devices, such as emitters and detectors, integrated onto the same silicon substrate. These devices would be co-located on the silicon and possibly interdigitated. Having very different functions, different photonic devices also have very different epitaxial layer construction. It is not economically feasible for two such dissimilar devices to be grown on the same substrate and so it is necessary that separate growth steps be performed for each device type. Photonic devices that have been integrated onto the surface of a silicon substrate are prone to damage during processing of the wafer unless they are properly protected. To this end, underfills or flowable hardeners, such as epoxy resins or photoresists, are typically applied to the regions surrounding the devices and cured to provide a level of mechanical stability. However, when different photonic device types are integrated in separate process steps, repeated application and removal of the underfill has been required. Removal of epoxy resin is very undesirable as it creates residues that are exceedingly difficult to clean from the substrate surface.

SUMMARY OF THE INVENTION

It is therefore an object of this invention to provide an improved method of integration of integrated circuit devices.

It is a further object of this invention to provide such an improved method which allows different devices to be flip-chipped onto a chip or substrate.

It is a further object of this invention to provide such an improved method which allows different devices to be flip-chipped onto a chip or substrate without loss of necessary mechanical support.

It is a further object of this invention to provide such an improved method which decouples the chip fabrication from the device fabrication.

It is a further object of this invention to provide such an improved method which allows different photonic devices to be flip-chipped onto a silicon substrate without loss of necessary mechanical support.

The invention results from the realization that an improved method of integration of integrated circuit devices is achieved when a first set of devices including some dummy devices are constructed on a first chip then flip-chip bonded to a second chip and underfilled for mechanical support after which the dummy devices are removed with their underfill but the underfill mechanically supporting the remaining non-dummy first devices is preserved and a second set of devices on a third chip are then flip-chipped into the holes left by the removal of the dummy devices and underfilled once again.

This invention features a method for integration of integrated circuit devices including providing an array of first devices including dummy devices on first chip and providing an array of contacts on a second chip. The first devices are flip-chip bonded to the contacts and the voids between the chips interstitially of the first devices are filled with an underfill. The first devices are masked leaving exposed pre-selected dummy devices. The dummy devices are removed leaving an array of holes with contacts. A spaced array of second devices on a third chip is provided matching the array of holes. The second devices are flip-chip bonded to the contacts in the holes and the voids between the chips associated with the second devices are filled with an underfill.

In a preferred embodiment the devices may include photonic devices. The first and third chips may include gallium arsenide. The second chip may include silicon. The second chip may include an application specific integrated circuit. One of the first and second devices may include light emitters and the other light detectors. One of the first and second devices may include vertical cavity surface emitting lasers and the other p-i-n diodes. The dummy devices may be the same as the first devices. The first and third chips may include indium phosphide or indium gallium arsenide nitride. The second chip may include silicon germanium or gallium arsenide. The underfill may include an epoxy or a photoresist. The method may include removing the first chip except for the first devices and removing the third chip except for the second devices.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

This invention relates to a method of integrating multiple types of devices onto a substrate. In the specific embodiment shown here the devices are photonic devices and they are eventually mounted on a silicon substrate. Specifically the devices are laser emitters and p-i-n detectors and the desired integration of the devices is interdigitation. It should be understood that this method could be used to integrate other types of devices quite different from the ones illustrated and with orientations quite different from the ones illustrated.

Figure 1:
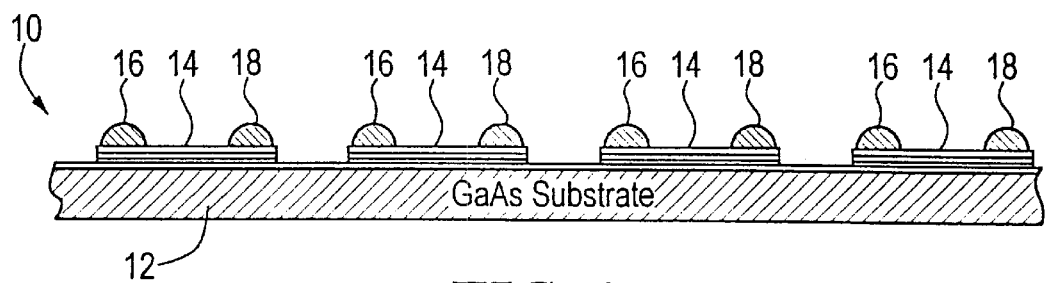
FIG. 1 is a schematic side elevational sectional view of a first chip according to this invention.

There is shown in FIG. 1 a first chip 10 including a GaAs substrate 12 having grown on it a number of vertical cavity surface emitting laser (VCSEL) emitters 14. Mounted on each of the VCSELs 14 are a number of solder balls or bumps two of which are shown 16 and 18. Some of these devices 14 are actually dummy devices and will be removed as seen subsequently with respect to FIGS. 5 and 6.

Figure 2:
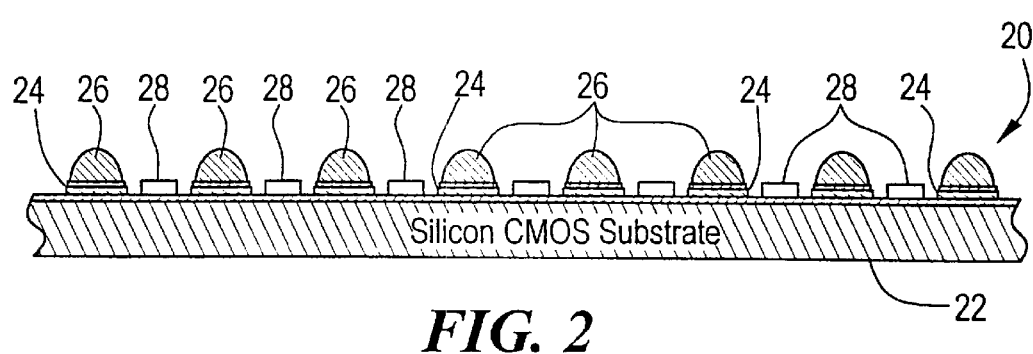
FIG. 2 is a schematic side elevational sectional view of a second chip according to this invention.

The second chip 20 FIG. 2 includes a silicon CMOS substrate 22 which carries a number of metal landing pads 24 each containing a solder ball or bump 26 so arranged that they mate with the solder bumps 16 and 18 of chip 10, FIG. 1. Also shown on chip 20 are portions 28 of an electronic circuit in this case an application specific integrated circuit (ASIC).

Figure 3:
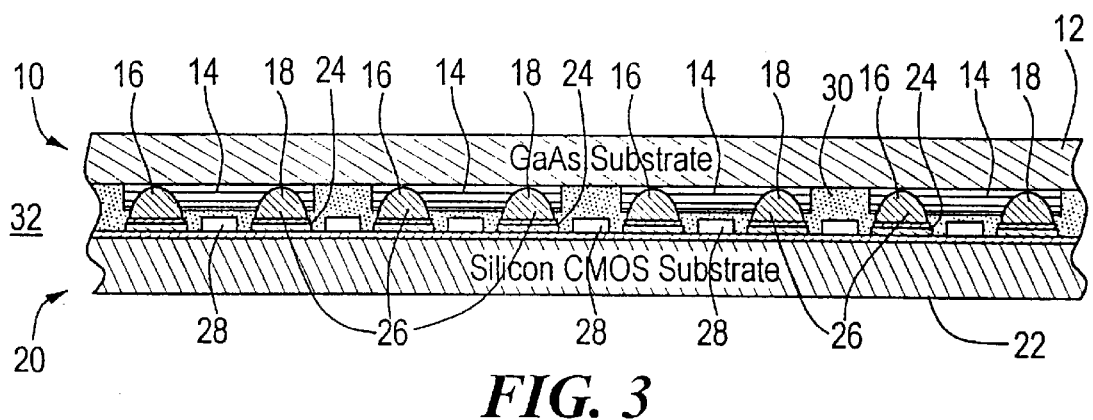
FIG. 3 is a schematic side elevational sectional view of a first chip bump bonded to the second chip and underfilled.

The first chip 10, FIG. 1 is flip-chipped and bump bonded onto the second chip 20 as shown in FIG. 3 and filled with an underfill 30 such as an epoxy, a photoresist, or any other suitable flowable hardener. Underfill 30, FIG. 3, fills the voids between the two chips and interstitially of the devices to complete the formation of assembly 32. Emitters 14 make electrical contact to the CMOS logic or the ASIC 28 on silicon CMOS substrate 22 through the use of the solder balls 16, 18, 26 and the metal landing pads 24. In this particular case all of the devices are identical being VCSELs grown on the same gallium arsenide substrate with the same layer construction.

The process steps following this typically involve mechanically and chemically removing the gallium arsenide substrate until the top surfaces of the emitters are exposed so that they can freely emit laser light in this particular case at a wavelength of 850 nm. Throughout the processing the underfill serves to provide physical stability for the emitters during the substrate removal and subsequent steps.

Figure 4:
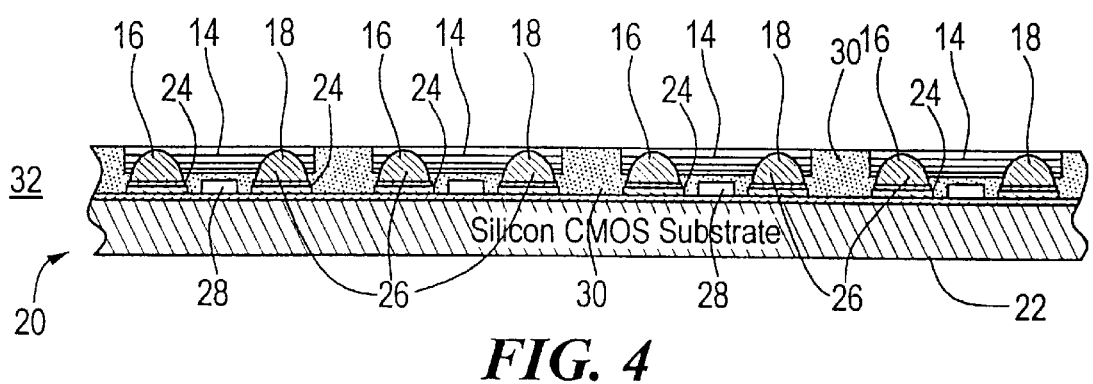
FIG. 4 is a schematic side elevational sectional view of a flip-chip assembly of FIG. 3 with the first chip removed except for the devices.

Gallium arsenide substrate 12 of first chip 10 is now removed by mechanical techniques and then by chemically etching with $SF_6/SiCl_4$ or other dry etch or by standard chlorine based, aqueous processes so that essentially all that is left of the first chip are the emitter structures 14, FIG. 4.

In this embodiment, it is intended that the emitters be integrated by interdigitation with laser detectors that have been grown on a separate gallium arsenide substrate. The optical devices do not however have to be grown on gallium arsenide substrates. In fact, they could be grown on InP or other III–V substrates or any combinations of substrates onto which light emitting or detecting devices can typically be grown. In the past this could have been accomplished by spacing the emitters much further apart to accommodate insertion of the detectors, removing the epoxy, and performing a number of flip-chip process step to deposit the detectors. In contrast, the present invention employs a photo lithographic step that applies a protective mask over those emitters that are to remain while leaving exposed certain of the emitters that are really dummy devices or blanks provided solely to reserve space for placement of the detectors. Once the protective mask has been applied, a further chemical etching is performed to remove the dummy devices but not the real devices or their associated underfill. In this way the epoxy resin is never removed so it continues to provide mechanical stability to the emitters that remain on the silicon substrate. Note that since the dummy devices do not actually remain as active components in the final product, they do not necessarily have to take the form of the emitter devices as they do here. Rather the dummies could be simply blank regions of gallium arsenide material or anything else that is formed between the active emitter devices and shaped so that when removed an opening or hole is formed that is compatible with the device (the detector in this case) which is to be later inserted or deposited.

Figure 5:
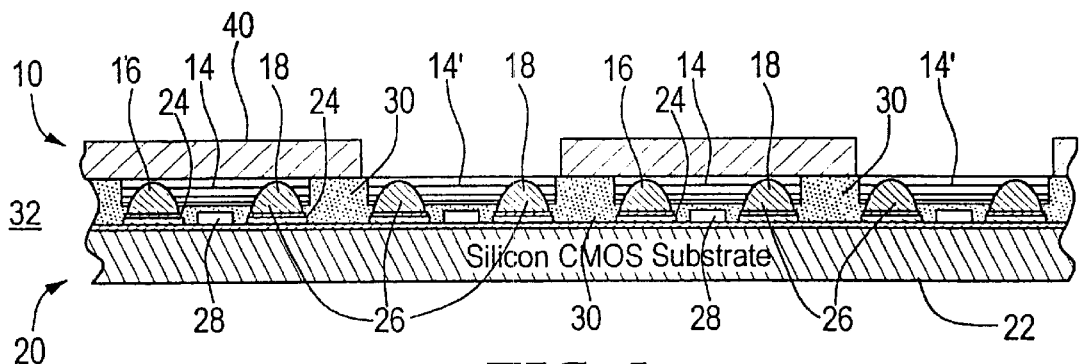
FIG. 5 is a schematic side elevational sectional view of the flip-chip assembly of FIG. 4 with a mask applied to expose dummy devices.
Figure 6:
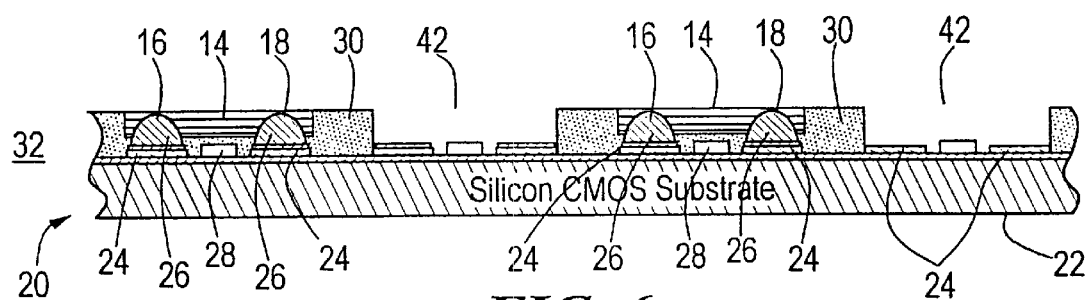
FIG. 6 is a schematic side elevational sectional view of the flip-chip assembly of FIG. 5 with the mask and dummy devices removed.
Figure 7:
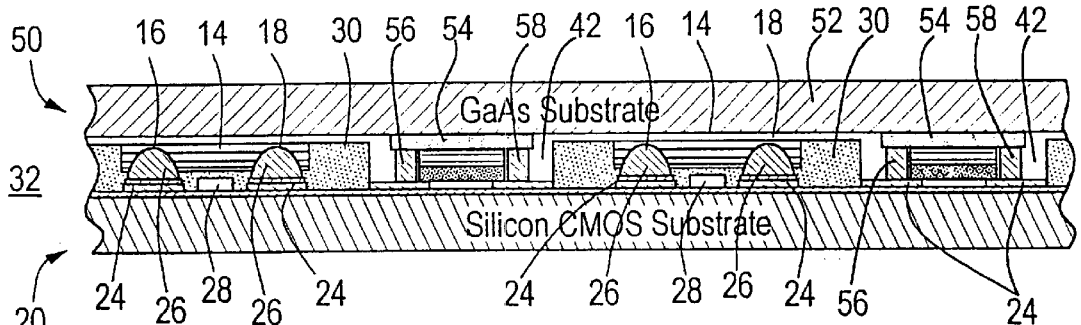
FIG. 7 is a schematic side elevational sectional view of a third chip flip-chip with a second type of device flip-chip bonded to the assembly of FIG. 6 with the second type of devices in the holes left by removal of the dummy devices.
Figure 8:
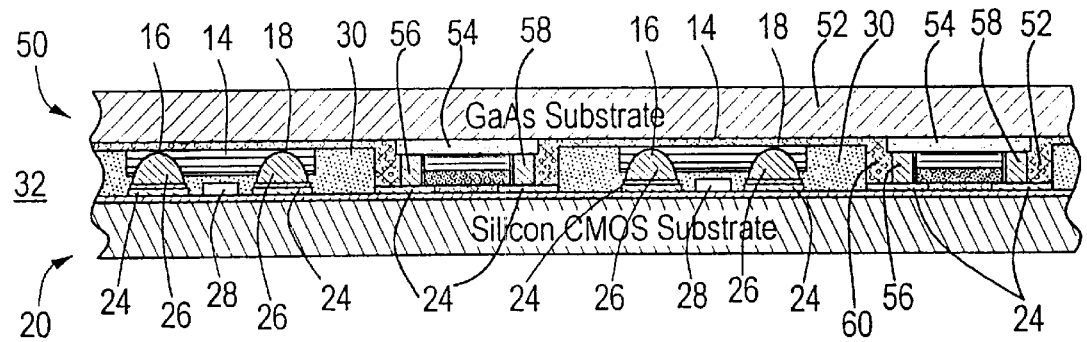
FIG. 8 is a view similar to FIG. 7 with underfill applied again.

A photoresist mask 40, FIG. 5 now covers those of detectors 14 which are to be preserved and exposes those detectors 14' which function as dummies and are to be removed. The photoresist may be a standard such as AZ4620 or other. The exposed dummy devices 14' are then removed by wet etching with a bromine-based solution, such as $BR_2/HBr/H_2O$, leaving holes 42, FIG. 6, with remaining metal landing pads 24. The photoresist is also removed using acetone. The third chip 50, FIG. 7, having a gallium arsenide substrate 52 with p-i-n diode detectors 54 grown on it is flip-chip bump bonded to the assembly 32 by aligning its detectors 54 with holes 42 and engaging solder balls or bumps 56, 58 with pads 24 in each of holes 42. An underfill such as an epoxy or a photoresist or other suitable material 60 is applied once again to fill the spaces between chips 50 and 20 surrounding the detectors 54 and other open areas as shown in FIG. 8. The third substrate 52 is then removed by the same mechanical and chemical means as above resulting in the completed assembly 32, FIG. 9, in which all of this gallium arsenide substrate 52 is removed except for the detectors 54.

Figure 9:
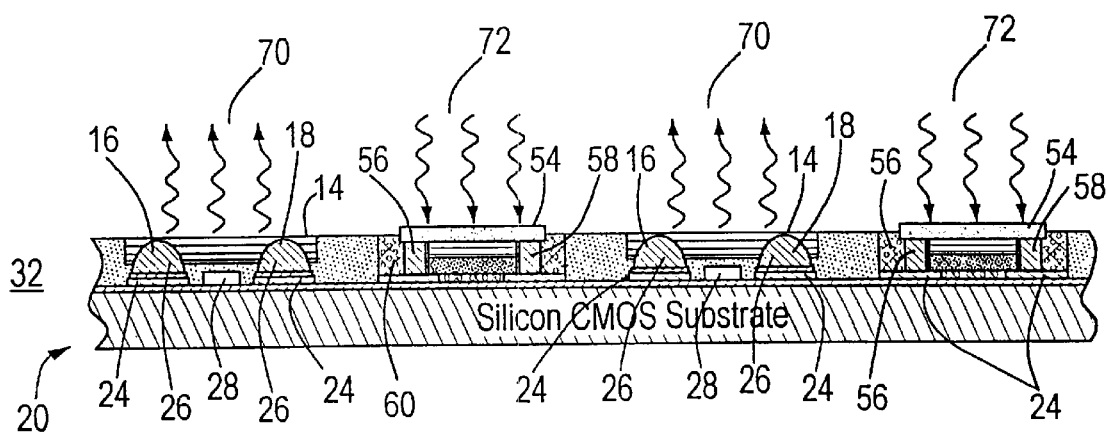
FIG. 9 is a view similar to FIG. 8 of an integrated circuit with two different types of devices on it according to this invention.
Figure 10:
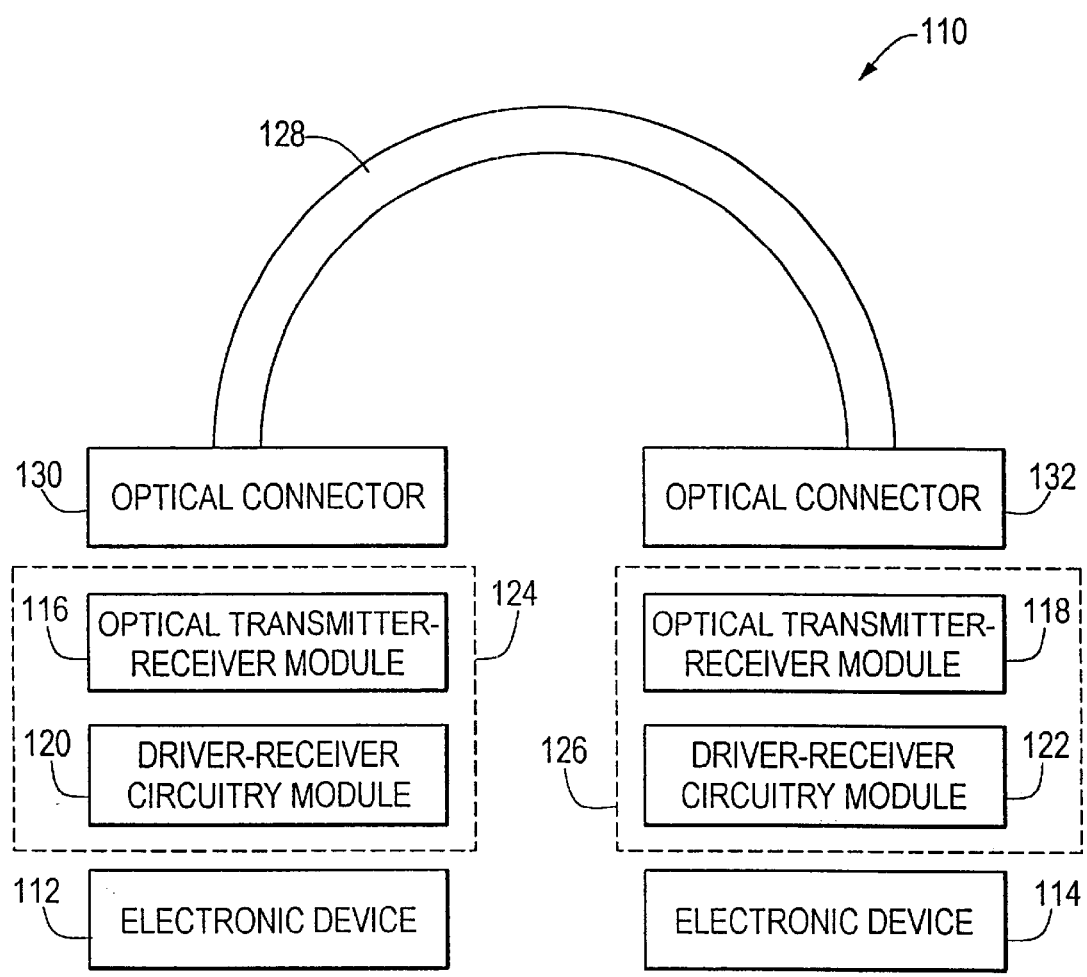
FIG. 10 is a schematic diagrammatic view of a communication system in which the multiple device integrated circuit assembly to this invention may be used.

Assembly 32 of FIG. 9 may be used in a communication system 110, FIG. 10, which provides for optical rather than electrical communication between electronic device 112 and electronic device 114. Electronic devices 112 and 114 may be computers, see U.S. Pat. No. 5,912,913, two circuit boards in one computer, or two different chips on one circuit board. U.S. Pat. No. 5,912,913 is incorporated herein by this reference.

Optical transmitter-receiver modules 116 and 118 typically include both light emitting devices such as vertical cavity surface emitting lasers (VCSELS) and light detecting devices such as photodiodes. Modules 116 and 118 may be in the form of chips such as assembly 32, FIG. 9 and the VCSELS and the photodiodes may be grown on the same substrate. See as the assembly of FIG. 5, U.S. Pat. No. 5,978,401 incorporated herein by this reference.

Driver-receiver circuitry modules 120 and 122 may be in the form of ASIC chips and include driver circuitry for receiving electrical signals from electronic devices 112 and 114 and, in response, driving the VCSELs of modules 120 and 122. The ASICs also include receiver circuitry for receiving signals from the photodiodes of modules 116 and 118 and in response processing these electrical signals and providing an appropriate output to electronic devices 112 and 114.

The combination of an optical transmitter receiver module (116,118) and a driver-receiver circuitry module (120,122) is called an optical transceiver as shown at 124 and 126. One way to hybridize or connect an optical transmitter module (116,118) to a driver-receiver circuitry module (120,122) is by flip chip bonding. See U.S. Pat. No. 6,005,262 incorporated herein by this reference.

Fiber optic cable 128 has one end connected to optical transmitter-receiver module 116 and its other end connected to optical transmitter-receiver module 118 via optical connectors 130 and 132, respectively. See U.S. Pat. No. 5,912,913.

In this way, electronic device 112 generates an electrical output signal received by module 120 which in turn drives the VCSELS of module 116 generating light pulses representative of the electrical output signal. These light pulses are coupled to fiber optic bundle 128 by optical connector 132. The detectors of module 118 then output an electrical signal representative of the light pulses and this electrical signal is processed by the receiver circuitry of module 122 and communicated to electronic device 114 for further processing.

As shown, system 110 is capable of bi-directional optical communications but in some embodiments uni-directional communications is accomplished if module 116 contains only VCSELs and module 118 contain only detectors in which case module 120 includes only VCSEL driving circuitry and module 122 includes only receiver circuitry.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A method for integration of integrated circuit devices comprising:

providing an array of first devices including dummy devices mounted on a first substrate of a first chip;

providing an array of contacts on a second chip;

flip-chip bonding said first devices to said contacts;

filling the voids between said chips interstitially of said first devices with an underfill;

removing said first substrate;

masking said first devices leaving exposed pre-selected dummy devices;

removing said dummy devices leaving an array of holes with contacts;

providing a spaced array of second devices on a third chip matching the array of holes;

flip-chip bonding said second devices to said contacts in said holes; and filling the voids between said chips associated with said second devices with an underfill.

2. The method of claim 1 in which said devices are photonic devices.

3. The method of claim 1 in which said first and third chips include gallium arsenide.

4. The method of claim 1 in which said second chip includes silicon.

5. The method of claim 1 in which said second chip includes an application specific integrated circuit.

6. The method of claim 1 in which one of said first and second devices include light emitters and the other light detectors.

7. The method of claim 1 in which one of said first and second devices include vertical cavity surface emitting lasers and the other includes p-i-n diodes.

8. The method of claim 1 in which said dummy devices are the same as said first devices.

9. The method of claim 1 in which said first and third chips include indium phosphide.

10. The method of claim 1 in which said first and third chips include indium gallium arsenide nitride.

11. The method of claim 1 in which said second chip includes silicon germanium.

12. The method of claim 1 in which said second chip includes gallium arsenide.

13. The method of claim 1 in which said underfill includes an epoxy.

14. The method of claim 1 in which said underfill includes a photoresist.

15. The method of claim 1 further includes removing said first chip except for said first devices.

16. The method of claim 1 in which further includes removing said third chip except for said second devices.

17. The method of claim 1 in which said underfill associated with said dummy devices is removed and said underfill associated with the remaining said first devices is preserved.

* * * * *